(12) United States Patent
Yen

(10) Patent No.: US 9,110,143 B2
(45) Date of Patent: Aug. 18, 2015

(54) DISCHARGE CURVE CALIBRATION SYSTEM AND CALIBRATION METHOD FOR INITIAL DISCHARGING CURVE OF BATTERY

(71) Applicant: VIA TECHNOLOGIES, INC., New Taipei (TW)

(72) Inventor: Sheng-Hsien Yen, New Taipei (TW)

(73) Assignee: VIA TECHNOLOGIES, INC., New Taipei (TW)

( * ) Notice: Subject to any disclaimer, the term of this patent is extended or adjusted under 35 U.S.C. 154(b) by 374 days.

(21) Appl. No.: 13/744,982

(22) Filed: Jan. 18, 2013

(65) Prior Publication Data

US 2013/0187657 A1    Jul. 25, 2013

Related U.S. Application Data

(60) Provisional application No. 61/588,821, filed on Jan. 20, 2012.

(51) Int. Cl.
*G01N 27/416* (2006.01)
*H02J 7/00* (2006.01)
(Continued)

(52) U.S. Cl.
CPC ........ *G01R 31/3606* (2013.01); *G01R 31/3624* (2013.01); *H01M 10/44* (2013.01); *H02J 7/0078* (2013.01); *G01R 31/3648* (2013.01); *G01R 35/005* (2013.01)

(58) Field of Classification Search
CPC .............. H02J 7/0078; G01R 31/3606; G01R 31/3648; H01M 10/44

USPC .............. 324/427; 320/132, 133, 135; 702/63
See application file for complete search history.

(56) References Cited

U.S. PATENT DOCUMENTS 6,794,852 B2 *   9/2004  Tran .............................. 320/132
7,091,698 B2     8/2006  Yamazaki et al.
(Continued)

FOREIGN PATENT DOCUMENTS

CN          1431521          7/2003
CN          1437031          8/2003
(Continued)

OTHER PUBLICATIONS

Pop, V., et al.; "Battery Management Systems Accurate State-of-Charge Indication for Battery Powered Applications;" Philips Research Bookstore Series; vol. 9; 2008' pp. 1-24.
(Continued)

*Primary Examiner* — M'Baye Diao
(74) *Attorney, Agent, or Firm* — McClure, Qualey & Rodack, LLP

(57) ABSTRACT

A calibration method for an initial discharging curve of a battery is provided. The method includes: measuring a first open circuit voltage at a first time point, a corresponding first discharge capacity, a second open circuit voltage at a second time point, and a corresponding second discharge capacity according to an initial discharging curve; calculating an ideal discharge capacity according to the first discharge capacity and the second discharge capacity; measuring an real discharge capacity between the first time point and the second time point; determining a total discharge capacity difference according to the ideal discharge capacity and the real discharge capacity to calibrate the initial discharging curve to generate a current discharging curve.

11 Claims, 4 Drawing Sheets

(51) Int. Cl.
    *G01R 31/36* (2006.01)
    *H01M 10/44* (2006.01)
    *G01R 35/00* (2006.01)

(56) References Cited

U.S. PATENT DOCUMENTS

| | | | |
|---|---|---|---|
| 7,092,830 B2 * | 8/2006 | Syracuse et al. | 702/63 |
| 7,560,935 B2 * | 7/2009 | Morimoto | 324/525 |
| 7,679,327 B2 * | 3/2010 | Kim et al. | 320/132 |
| 8,253,380 B2 * | 8/2012 | Sun et al. | 320/128 |
| 8,604,755 B2 * | 12/2013 | Nishimura et al. | 320/132 |
| 2002/0167293 A1 | 11/2002 | Ptasinski et al. | |
| 2002/0193953 A1 * | 12/2002 | Hoenig et al. | 702/63 |
| 2004/0113590 A1 * | 6/2004 | Rosenquist et al. | 320/132 |
| 2005/0040789 A1 * | 2/2005 | Salasoo et al. | 320/119 |
| 2005/0167474 A1 * | 8/2005 | Kanno et al. | 228/183 |
| 2005/0258259 A1 * | 11/2005 | Stanimirovic | 236/49.1 |
| 2006/0219734 A1 | 10/2006 | Pessin et al. | |
| 2007/0170893 A1 | 7/2007 | Kao et al. | |
| 2010/0138176 A1 | 6/2010 | Yu | |
| 2011/0193529 A1 * | 8/2011 | Nishimura et al. | 320/134 |
| 2011/0226559 A1 | 9/2011 | Chen et al. | |
| 2013/0110428 A1 * | 5/2013 | Sun et al. | 702/63 |

FOREIGN PATENT DOCUMENTS

| | | |
|---|---|---|
| CN | 1541337 | 10/2004 |
| CN | 101408591 | 4/2009 |
| CN | 101819259 | 9/2010 |
| CN | 102081143 | 6/2011 |
| CN | 102121973 | 7/2011 |
| CN | 102135603 | 7/2011 |
| CN | 102230953 | 11/2011 |

OTHER PUBLICATIONS

Shepard, C.M.; "Design of Primary and Secondary Cells II. An Equation Describing Battery Discharge;" Journal of the Electrochemical Society; Jul. 1965; pp. 657-664.

"Research on Battery Management System for Hybrid Electric Vehicle;" Aug. 18, 2004; pp. 75-79.

Li, S.F, et al.; "Research and Implementation on Accurate Measurement of Battery Capacity;" Computer Engineering and Applications; Jun. 30, 2009; pp. 244-248.

Chan, H.L, et al.; "A New Battery Model for use with battery energy storage systems and electric vehicles power systems;" IEEE; Jan. 27, 2000; pp. 470-475.

English language translation of abstract of CN 1431521 (published Jul. 23, 2003).

English language translation of abstract of CN 1437031 (published Aug. 20, 2003).

English language translation of abstract of CN 1541337 (published Oct. 27, 2004).

English language translation of abstract of CN 101408591 (published Apr. 15, 2009).

English language translation of abstract of CN 101819259 (published Sep. 1, 2010).

English language translation of abstract of CN 102081143 (published Jun. 1, 2011).

English language translation of abstract of CN 102121973 (published Jul. 13, 2011).

English language translation of abstract of CN 102135603 (published Jul. 27, 2011).

English language translation of abstract of CN 102230953 (published Nov. 2, 2011).

* cited by examiner

DISCHARGE CURVE CALIBRATION SYSTEM AND CALIBRATION METHOD FOR INITIAL DISCHARGING CURVE OF BATTERY

CROSS REFERENCE TO RELATED APPLICATIONS

This application claims the benefit of U.S. Provisional Application No. 61/588,821 filed Jan. 20, 2012, the entirety of which is incorporated by reference herein.

BACKGROUND OF THE INVENTION

1. Field of the Invention

The present invention relates to an electric capacity estimation method for a rechargeable battery and a discharge curve calibration system for calibrating a discharging curve of a rechargeable battery, and more particularly, to the electric capacity estimation method and the calibration system for an aged rechargeable battery.

2. Description of the Related Art

In the recent years, electronic devices have been manufactured much thinner, lighter and smaller. A lithium battery is provided with the advantages of small-sized, light weight and rechargeable. Thus the lithium battery is usually adapted to the electronic devices, such as mobile electronic devices (mobile phone or electric vehicle), for power providing.

Typically, the residual capacity of a battery in ordinary electric devices is estimated by a capacity estimation method. The estimation result is shown on a display of the electric device to inform users the residual capacity of the battery. However, the battery may age with charging/discharging times increasing. If the aging degree is not taken into account, the estimation result may not be accurate.

BRIEF SUMMARY OF THE INVENTION

An embodiment of the invention provides a calibration method for a discharging curve of a battery. The method comprises the steps of: acquiring an initial discharging curve of the battery; measuring a first open circuit voltage value of the battery at a first time point and a second open circuit voltage value of the battery at a second time point; according to the initial discharging curve, acquiring a first discharge capacity corresponding to the first open circuit voltage value and a second discharge capacity corresponding to the second open circuit voltage value; calculating an ideal discharge capacity according to the first discharge capacity and the second discharge capacity; measuring an actual discharge capacity of the battery between the first time point and the second time point; and calibrating the initial discharging curve to generate a current discharging curve according to a total discharge capacity difference between the ideal discharge capacity and the actual discharge capacity.

Another embodiment of the invention provides a discharge curve calibration system capable of calibrating an initial discharge curve of a battery. The discharge curve calibration system comprises a discharge capacity measuring unit and a controller. The discharge capacity measuring unit is coupled to the battery to measure a discharge capacity of the battery. The controller calculates an ideal discharge capacity according to the initial discharge curve, a first open circuit voltage value of the battery at a first time point and a second open circuit voltage value of the battery at a second time point. The controller controls the discharge capacity measuring unit to measure a real discharge capacity of the battery between the first time point and the second time point. The controller calibrates the initial discharging curve to generate a current discharging curve according to a total discharge capacity difference between the ideal discharge capacity and the actual discharge capacity.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description shows several exemplary embodiments carrying out the invention. This description is made for the purpose of illustrating the general principles of the invention and should not be taken in a limiting sense. The scope of the invention is best determined by reference to the appended claims.

Figure 1:
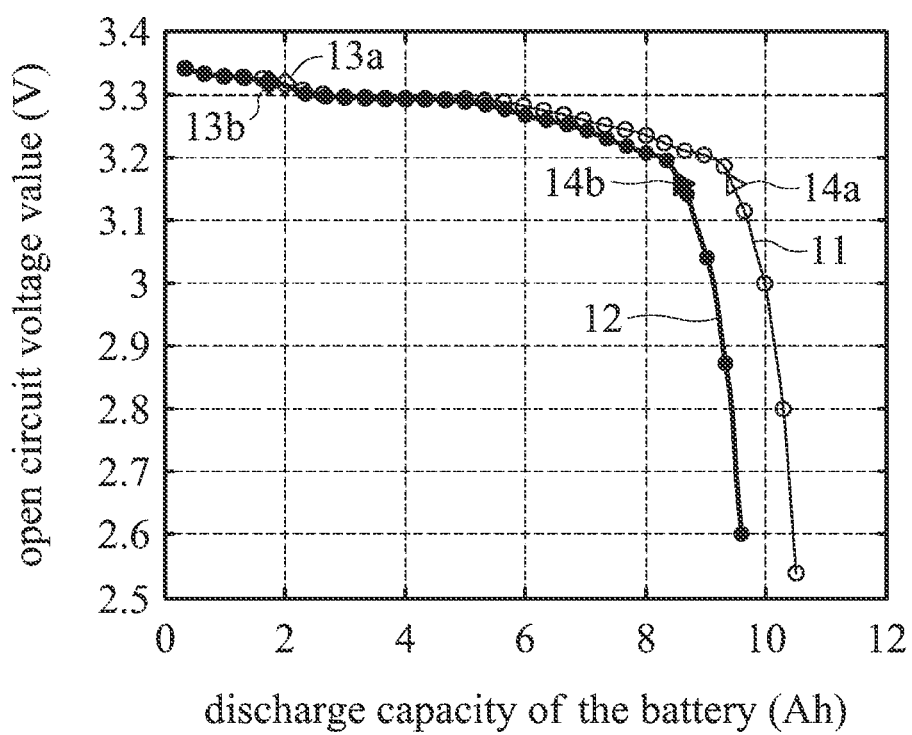
FIG. 1 is a schematic diagram of a discharge curve of a battery.

FIG. 1 is a schematic diagram of a discharge curve of a battery. The vertical axis of FIG. 1 represents the open circuit voltage value of the battery and the horizontal axis of FIG. 1 represents the discharge capacity of the battery. After the battery has been charged and discharged for several times, the battery becomes aged and the discharge capacity of the battery is decreased corresponding to the same open circuit voltage value. Compared with a health battery, the discharge capacity of the aged battery decreases faster. Thus, the initial discharge curve 11 of the battery is different from a current discharge curve 12.

The initial discharge curve 11 can be provided by the battery manufacturer or measured by an electronic device when the battery is first used. The current discharge curve 12 is a curve of the relation between the open circuit voltage and the real discharge capacity of the battery after the battery has been used for a period of time (e.g. charged/discharge for several times). Note that the open circuit voltage is a terminal voltage of the battery after the battery has been in a rest condition for a period of time after the discharging is completed. In practice, the discharge capacity and the open circuit voltage is measured by a recharge and discharge machine. Since the open circuit voltage is preferable measured after the battery has been in a rest condition for a period of time after the discharging is completed, it is inconvenient for a user to measure the open circuit voltage of the battery.

In FIG. 1, the initial discharge curve 11 comprises a plurality of sample points. Each sample point corresponds to a discharge capacity and an open circuit voltage, and except the first discharge interval and the last discharge interval, the discharge capacity of each discharge interval is a fixed value, wherein the discharge interval means the interval between any two adjoining sample points. In one embodiment, the fixed value is 0.3333 Ah. When the battery is fully charged and starts to be discharged, a plurality of sample points are recorded when the battery has been discharged for a capacity of 0.3333 Ah each time. When the voltage value of the battery reaches a discharge-off voltage value, the last discharge capacity of the battery may be less than 0.3333 Ah. On the contrary, when the battery has been fully discharged and starts to be charged, a plurality of sample points are recorded when the battery has been charged for a capacity of 0.3333 Ah each time to generate a charge curve of the battery. When the voltage value of the battery reaches a charge-off voltage value, the last charge capacity of the battery may be less than 0.3333 Ah. Therefore, the capacity of first discharge interval and the last discharge interval may be different from the capacity of other discharge intervals.

The discharge capacity of any two adjoining sample points on the initial discharge curve 11 is fixed. When the battery is discharged for a predetermined amount of charge, the open circuit voltage value of the battery is measured and recorded. In another embodiment, the initial discharge curve 11 can be shown in a form of a lookup table comprising charge capacities with corresponding open circuit voltage values. Similarly, the current discharge curve 12 is generated by measuring the open circuit voltage value of the battery when the battery has been discharged for a predetermined amount of charge. In one embodiment, a Coulomb counter is applied to measure the discharge capacity of the battery and a voltage measuring circuit is applied to measure the open circuit voltage value of the battery.

As shown in FIG. 1, the difference between the initial discharge curve 11 and the current discharge curve 12 becomes larger with the decreasing of the open circuit voltage. In other words, a difference between an ideal discharge capacity and a real discharge capacity increases with the decreasing of the open circuit voltage. The invention proposes a calibration method to calibrate the initial discharge curve 11 according to the capacity differences of two open circuit voltage values between an ideal discharge capacity and a real discharge capacity to acquire the current discharge curve 12. As a result of the calibration discharge curve, the electronic device can use the battery efficiently.

Figure 2:
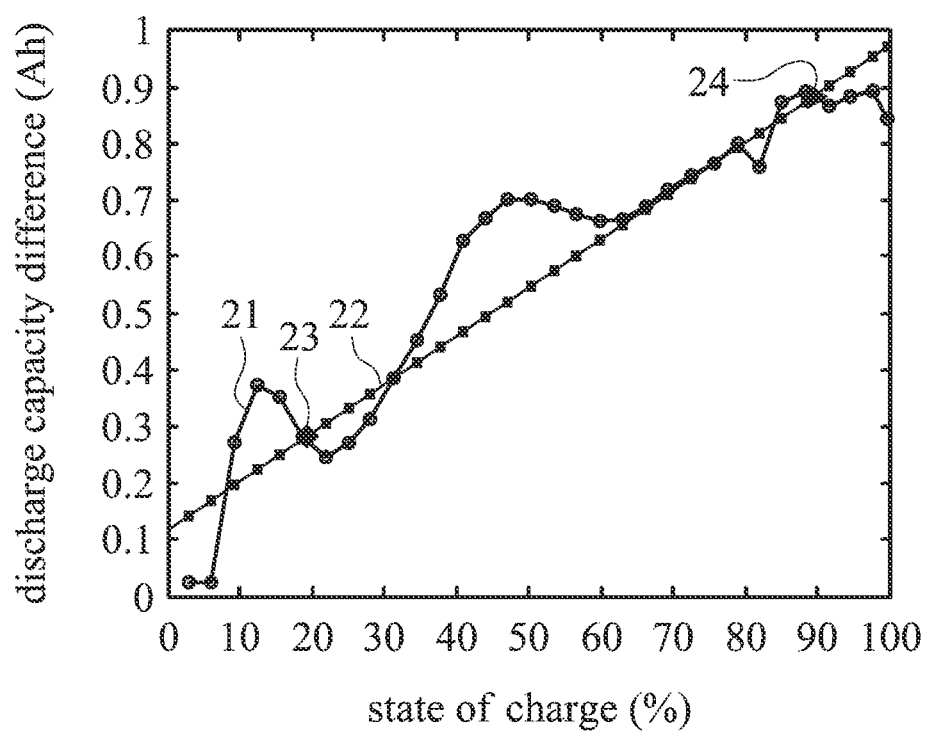
FIG. 2 is a schematic diagram showing a battery capacity difference between an initial state of a battery and an aged state of the battery and an approximation curve.

Please refer to FIG. 1 and FIG. 2. FIG. 2 shows battery capacity differences between an initial state of a battery and an aged state of the battery after the battery has been used for a period of time, and an approximation curve 22 generated according to the battery capacity differences. The capacity difference curve 21 is generated according to the initial discharge curve 11 and the current discharge curve 12 in FIG. 1. The vertical axis of the capacity difference curve 21 represents a discharge capacity difference between the discharge capacity acquired from the initial discharge curve 11 and the discharge capacity acquired from the current discharge curve 12 corresponding to the same open circuit voltage value. The horizontal axis of the capacity difference curve 21 is a state of charge (SOC), or called residual capacity. The state of charge is generated by dividing the discharge capacity of the battery by the initial total capacity of the battery. The approximation curve 22 is generated according to the sample points 13a, 13b, 14a and 14b of FIG. 1 in this embodiment.

The sample point 13a represents a first discharge capacity of the battery corresponding to a first open circuit voltage value on the initial discharge curve 11.

The sample point 14a represents a second discharge capacity of the battery corresponding to a second open circuit voltage value on the initial discharge curve 11.

The sample point 13b represents the real discharge capacity of the battery corresponding to the first open circuit voltage value. The real discharge capacity corresponding to the first open circuit voltage value is called a third discharge capacity in this embodiment.

The sample point 14b represents the real discharge capacity of the battery corresponding to the second open circuit voltage value. The real discharge capacity corresponding to the second open circuit voltage value is called a fourth discharge capacity in this embodiment.

In FIG. 2, the value of the vertical axis of the first sample point 23 represents a discharge capacity difference between the discharge capacity of the sample point 13a (first discharge capacity) and the discharge capacity of the sample point 13b (third discharge capacity), and the value of the horizontal axis of the first sample 23 represents a corresponding residual capacity of the battery.

The value of the vertical axis of the second sample point 24 represents a discharge capacity difference between the discharge capacity of the sample point 14a (second discharge capacity) and the discharge capacity of the sample point 14b (fourth discharge capacity), and the value of the horizontal axis of the first sample 24 represents a corresponding residual capacity of the battery. Thus, the approximation curve 22 can be generated according to the first sample point 23 and the second sample point 24.

As the above paragraphs describe, the calibration method of the invention generates the current discharge curve 12 according to a total discharge capacity difference of two open circuit voltage values between an ideal discharge capacity and a real discharge capacity.

The following paragraph explains how to acquire the ideal discharge capacity. Take FIG. 1 for example. When the battery is in a rest condition for a period of time, the open circuit voltage value of the battery is measured to be 3.3164V at a first time point, and the corresponding discharge capacity on the initial discharge curve 11 is 2.0204 (Ah), shown as the sample point 13a in FIG. 1. After the battery is used or discharged for a period of time, the open circuit voltage value of the battery is measured to be 3.1571V and the corresponding discharge capacity on the initial discharge curve 11 is 9.4386 (Ah), shown as the sample point 14a in FIG. 1. It can be known that the ideal discharge capacity is 9.4386−2.0204=7.4182 (Ah) according to the initial discharge curve 11.

The following paragraph explains how to acquire the real discharge capacity. A discharge capacity measuring unit, such as a Coulomb counter, measures the real discharge capacities at a first time point and a second time point. Reference can be made to the following for the acquiring of the third discharge capacity corresponding to the sample 13b.

First, the battery is charged to full and the Coulomb counter is reset. In other words, the count value of the Coulomb counter is set to be zero. Then, the Coulomb counter starts measuring the discharge capacity of the battery. The controller reads the measured value of the Coulomb counter to get the third discharge capacity at the first time point.

After the battery has been used or discharged for a period of time, the open circuit voltage of the battery is measured and the open circuit voltage value is measured to be 3.1517V at the second time point. By looking up the initial discharge curve 11, the corresponding discharge capacity is 9.4386 (Ah), shown as the sample point 14a in FIG. 1. The real discharge capacity is measured by the Coulomb counter shown as the sample point 14b.

According to the initial discharge curve 11, an ideal discharge capacity between the sample points 13a and 14a is 7.4182 (Ah). According to the measured result of the Coulomb counter, the real discharge capacity between the sample point 13*b* and 14*b* is 6.8476 (Ah). Because a total discharge capacity difference between the ideal discharge capacity and the real discharge capacity is applied to calibrate the initial discharging curve 11, the Coulomb counter has to measure the real discharge capacity. The Coulomb counter can be reset at the first time point and the controller reads the measure value of the Coulomb counter at the second time point to know the real discharge capacity in other embodiments.

According to the ideal discharge capacity and the real discharge capacity, a total discharge capacity difference between the first sample point 23 and the second sample point 24 in FIG. 2 is 0.5705 (Ah).

In FIG. 1, the discharge capacity between two adjoining samples is 0.3333 (Ah). In other words, the discharge capacity corresponding to each discharge interval is 0.3333 (Ah). According to the initial discharge curve 11, the ideal discharge capacity between the sample point 13*a* and the sample point 14*a* is 7.4182 (Ah). The count of the discharge intervals between the sample point 13*a* and the sample point 14*a* can be acquired as follows:

7.4182/0.3333=22.2545

The total discharge capacity difference is equally distributed to the discharge intervals and an averaged discharge capacity difference of the discharge interval is calibrated. The calibration amount of the averaged discharge capacity difference of the discharge interval is shown as follows: 0.5702/22.2545=0.0256 (Ah)

The discharge capacities of sample points of the initial discharge curve 11 can be expressed as follows:

0.3111 0.6444 0.9777 1.3110 1.6443
1.9776 2.3109 2.6442 2.9775 3.3108
3.6441 3.9774 4.3107 4.6440 4.9773
5.3106 5.6439 5.9772 6.3105 6.6438
6.9771 7.3104 7.6437 7.9770 8.3103
8.6436 8.9769 9.3102 9.6435 9.9768
10.310 10.505

The discharge capacity differences between two adjoining sample points are expressed as follows, wherein the discharge capacity of the reference point is 0.

0.3111 0.3333 0.3333 0.3333 0.3333
0.3333 0.3333 0.3333 0.3333 0.3333
0.3333 0.3333 0.3333 0.3333 0.3333
0.3333 0.3333 0.3333 0.3333 0.3333
0.3333 0.3333 0.3333 0.3333 0.3333
0.3333 0.3333 0.3333 0.3333 0.3333
0.3333 0.1953

A calibrated discharge capacity of each discharge interval is acquired by subtracting the averaged discharge capacity difference (0.0256 Ah) of each discharge interval from the discharge capacity of each discharge interval (0.3333 Ah). The calibrated discharge capacity of each discharge interval is 0.3077 (Ah).

0.3333 (Ah)−0.0256 (Ah)=0.3077 (Ah).

The discharge capacity of the first discharge interval is acquired by the following equation:

(0.3111/0.3333)×0.3077=0.287 (Ah)

The discharge capacity of the last discharge interval is acquired by the following equation:

(0.1953/0.3333)×0.3077=0.1802 (Ah)

After calibration, the discharge capacities of discharge intervals can be expressed as follows:

0.2872 0.3077 0.3077 0.3077 0.3077
0.3077 0.3077 0.3077 0.3077 0.3077
0.3077 0.3077 0.3077 0.3077 0.3077
0.3077 0.3077 0.3077 0.3077 0.3077
0.3077 0.3077 0.3077 0.3077 0.3077
0.3077 0.3077 0.3077 0.3077 0.3077
0.3077 0.1802

According to the discharge capacities of discharge intervals, the calibrated discharge capacities corresponding to sample points of the initial discharge curve 11 after calibration can be expressed as follows:

0.2872 0.5949 0.9025 1.2102 1.5178
1.8255 2.1332 2.4408 2.7485 3.0561
3.3638 3.6714 3.9791 4.2867 4.2867
4.5944 4.9020 5.2097 5.5174 5.8250
6.1327 6.4403 6.7480 7.0556 7.3633
7.6409 7.9786 5.2862 8.5939 8.9016
9.5169 9.6971

According to the above calibrated discharge capacities, the current discharge curve 12 can be generated. The controller of the electronic device can estimate the residual capacity of the battery more precisely, and controls the electronic device more efficiently according to the current discharge curve 12.

The embodiment illustrates a discharging condition of the battery with FIG. 1 and FIG. 2, but the invention is not limited thereto. The proposed method can be applied to the charging condition of the battery.

Furthermore, in the conventional design, all the open circuit voltage values and the discharge capacities of sample points on the current discharge curve 12 are all stored in a memory. The proposed innovation provides another storage method. According to the described paragraphs, the current discharge curve 12 is mainly generated by calibrating each discharge capacity of each discharge interval of the initial discharge curve 11. The open circuit voltage values of sample points of the current discharge curve 12 are the same as the open circuit voltage values of sample points of the current discharge curve 11. Moreover, except for the discharge capacities of the first discharge interval and the last discharge interval, the discharge capacities of the middle discharge intervals are the same. Therefore, in the proposed innovation, only the open circuit voltage values corresponding to the sample points, the discharge capacity of the middle discharge interval, the ratio of the first discharge interval to the middle discharge interval, and the ratio of the last discharge interval to the middle discharge interval need to be stored. Take FIG. 1 for example. The memory only needs to provide 32 storage units to store the current discharge curve 12. The 35 storage units comprises 32 storage units storing the open circuit voltage values, one storage unit storing the discharge capacity of the middle discharge interval of the initial discharge curve 11, and 2 storage units storing the ratio of the first discharge interval to the middle discharge interval and the ratio of the last discharge interval to the middle discharge interval. In other words, it only takes 35 storage units to store the information of the current discharge curve 12. On the contrary, the conventional design requires 64 or (32+32) storage units to store the information of the current discharge curve 12. The proposed innovation eliminates almost half the amount of the memory units. Especially when the proposed calibration method for the discharge curve is applied to a battery module with battery units, the saved amount of the memory units is much more significant. Take a battery module having 16 battery units for example. The current discharge curve of each battery unit is generated by calibrating the initial discharge curve according to the state of each battery unit. Thus, the open circuit voltage values of each battery unit are the same and can be shared. Moreover, the ratio of the first discharge interval to the middle discharge interval and the ratio of the last discharge interval to the middle discharge interval of each battery unit are the same too. Only the discharge capacity of the middle discharge interval of each battery unit is different. Thus, the storage units for storing current discharge curves of 16 battery units comprises 32 storage units storing the open circuit voltage values, 2 storage units for storing the ratio of the first discharge interval to the middle discharge interval and the ratio of the last discharge interval to the middle discharge interval, and 6 storage units for storing the discharge capacity of the middle discharge interval of each battery unit. Only 50 storage units are required according to the proposed innovation to store the information of the current discharge curves of the battery units. On the contrary, the conventional design requires 1024 or (32+32)×16 storage units to store the information of the current discharge curves of the battery units. The proposed innovation eliminates a significant amount of the storage units.

Figure 3:
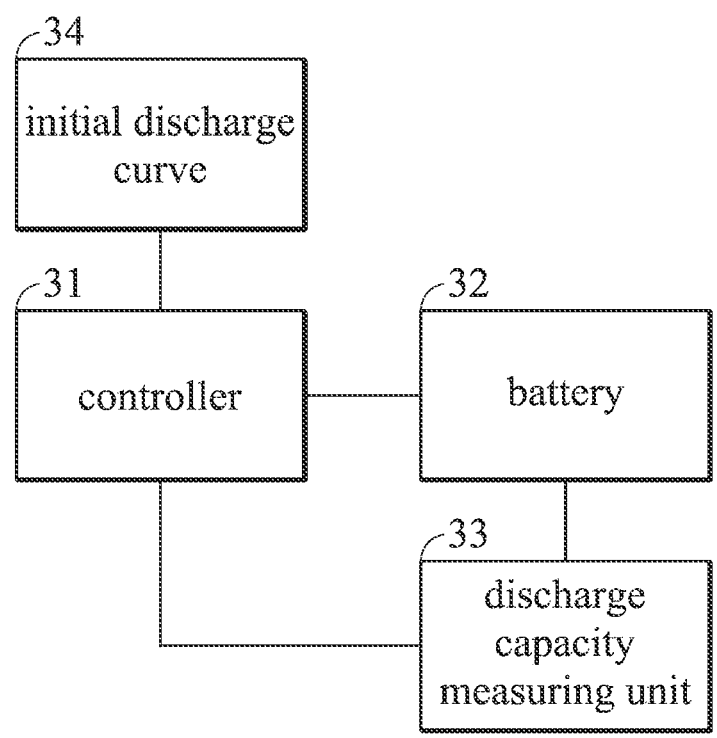
FIG. 3 is a schematic diagram of an embodiment of a discharge curve calibration system according to the invention.

FIG. 3 is a schematic diagram of an embodiment of a discharge curve calibration system according to the invention. The discharge curve calibration system calibrates an initial discharge curve 34 of a battery 32. The discharge curve calibration system comprises a controller 31 and a discharge capacity measuring unit 33. The discharge capacity measuring unit 33 is coupled between the battery 32 and a load circuit (not shown in FIG. 3) to measure an amount of electric charge that is transmitted to the load circuit. The initial discharge curve 34 can be provided by the battery manufacturer or measured by the controller and the discharge capacity measuring unit 33 when the battery 32 is first used in an electronic system. Preferably, the discharge capacity measuring unit 33 is a Coulomb counter.

When the battery 32 is charged and discharged for several times, the battery 32 ages. Thus, voltage of the battery 32 and the discharge capacity (or residual capacity) is not consistent with the initial discharge curve 34. Therefore, the controller 31 calibrates the initial discharge curve 34 to generate a current discharge curve according to current states of the battery 32.

The controller 31 calculates an ideal discharge capacity according to the initial discharge curve 34, a first open circuit voltage value of the battery 32 at a first time point and a second open circuit voltage value of the battery 32 at a second time point. The controller 31 measures a real discharge capacity of the battery 32 between the first time point and the second time point. Then, the controller calibrates the initial discharge curve 34 to generate a current discharge curve according to a total discharge capacity difference between the ideal discharge capacity and the actual discharge capacity.

In one embodiment, the controller 31 measures a first open circuit voltage value of the battery 32 at a first time point and looks up the initial discharge curve 34 to acquire a first discharge capacity according to the first open circuit voltage value. Then, the controller 31 resets the discharge capacity measuring unit 33. After resetting, the discharge capacity measuring unit 33 measures the amount of electric charge output by the battery 32. At a second time point, the controller 31 measures a second open circuit voltage value of the battery 32 and looks up the initial discharge curve 34 to acquire a second discharge capacity according to the second open circuit voltage value. The controller then measures a real discharge capacity of the battery 32 between the first time point and the second time point via the discharge capacity measuring unit 33.

The controller 31 estimates an ideal discharge capacity according to the first discharge capacity and the second discharge capacity, and then estimates the total discharge capacity difference according to the ideal discharge capacity and the real discharge capacity.

The initial discharging curve 34 comprises plurality of sample points and each sample point corresponds to a discharge capacity and an open circuit voltage value. A discharge interval means the interval between two adjoining sample points. In one embodiment, except for the first discharge interval and the last discharge interval, the discharge capacity of each discharge interval is a fixed value. In one embodiment, the battery 32 is fully charged and then discharged. When the battery 32 is discharged for 0.3333 Ah, a plurality of sample point and the open circuit value of battery 32 are recorded. The controller 31 estimates a count of discharge intervals between the first time point and the second time point according to the ideal discharge capacity and the discharge capacity of each discharge interval. Assuming there are N discharge intervals between the first time point and the second time point, and a total discharge capacity difference is X (Ah), an averaged discharge capacity difference of each discharge interval is X/N (Ah). Then, the controller 31 calibrates the initial discharging curve 34 to generate the current discharge curve according to the averaged discharge capacity difference and the count of the discharge intervals. Reference can be made to the descriptions of FIG. 1 and FIG. 2 for detailed description of the averaged discharge capacity difference.

Figure 4:
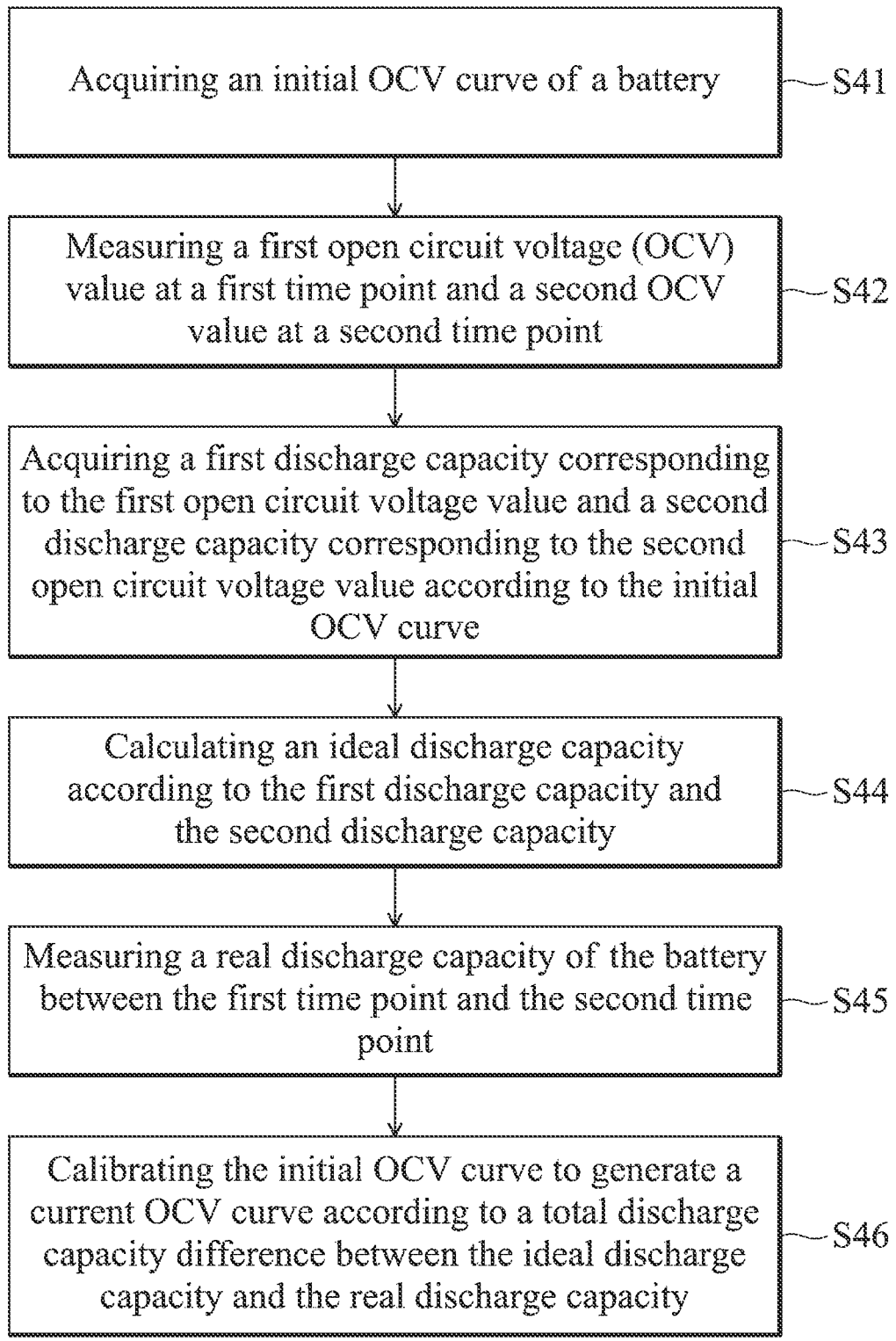
FIG. 4 is a flow chart of an embodiment of a calibration method for a discharging curve of a battery to the invention.

FIG. 4 is a flow chart of an embodiment of a calibration method for a discharging curve of a battery to the invention. In the step S41, a controller first acquires an initial OCV curve of a battery. The OCV curve comprises a plurality of sample points. The vertical axis of the OCV curve represents the electric capacity of the battery and the horizontal axis of the OCV curve represents the open circuit voltage value of the battery. In this embodiment, the initial OCV curve illustrates an initial discharging curve of the battery. In another embodiment, the horizontal axis of the OCV curve represents a discharge capacity or charge capacity of the battery, and the vertical axis represents the open circuit voltage value of the battery.

In the step S42, the controller measures a first open circuit voltage (OCV) value at a first time point and a second OCV value at a second time point. In the step S43, the controller acquires a first discharge capacity corresponding to the first open circuit voltage value and a second discharge capacity corresponding to the second open circuit voltage value according to the initial OCV curve.

In the step S44, the controller calculates an ideal discharge capacity according to the first discharge capacity and the second discharge capacity.

In the step S45, the controller measures a real discharge capacity of the battery between the first time point and the second time point. Then, in the step S46, the controller calibrates the initial OCV curve to generate a current OCV curve according to a total discharge capacity difference between the ideal discharge capacity and the actual discharge capacity.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A calibration method for a discharging curve of a battery, comprising:
   acquiring an initial discharging curve of the battery;

measuring a first open circuit voltage value of the battery at a first time point and a second open circuit voltage value of the battery at a second time point;

according to the initial discharging curve, acquiring a first discharge capacity corresponding to the first open circuit voltage value and a second discharge capacity corresponding to the second open circuit voltage value;

calculating an ideal discharge capacity according to the first discharge capacity and the second discharge capacity;

measuring a real discharge capacity of the battery between the first time point and the second time point; and calibrating the initial discharging curve to generate a current discharging curve according to a total discharge capacity difference between the ideal discharge capacity and the real discharge capacity, wherein the initial discharging curve comprises a plurality of sample points, wherein each sample point corresponds to a discharge capacity and an open circuit voltage, and the step of calibrating the initial discharging curve to generate the current discharging curve according to the discharge capacity difference further comprises the step of:

calibrating discharge intervals between any two adjoining sample points according to the total discharge capacity difference to generate the current discharging curve.

2. The method as claimed in claim 1, wherein the step of measuring the real discharge capacity of the battery between the first time point and the second time point further comprises:

measuring the real discharge capacity by a Coulomb counter.

3. The method as claimed in claim 2, wherein the Coulomb counter is reset at the first time point.

4. The method as claimed in claim 1, further comprising:

calculating a count of discharge intervals between the first time point and the second time point according to the ideal discharge capacity.

5. A calibration method for a discharging curve of a battery, comprising:

acquiring an initial discharging curve of the battery;

measuring a first open circuit voltage value of the battery at a first time point and a second open circuit voltage value of the battery at a second time point;

according to the initial discharging curve, acquiring a first discharge capacity corresponding to the first open circuit voltage value and a second discharge capacity corresponding to the second open circuit voltage value;

calculating an ideal discharge capacity according to the first discharge capacity and the second discharge capacity;

measuring a real discharge capacity of the battery between the first time point and the second time point;

calibrating the initial discharging curve to generate a current discharging curve according to a total discharge capacity difference between the ideal discharge capacity and the real discharge capacity;

calculating a count of discharge intervals between the first time point and the second time point according to the ideal discharge capacity;

calculating an averaged discharge capacity difference according to the count of the discharge intervals and the total discharge capacity difference; and calibrating the initial discharging curve according to the averaged discharge capacity difference and the count of the discharge intervals.

6. A discharge curve calibration system, capable of calibrating an initial discharge curve of a battery, comprising:

a discharge capacity measuring unit, coupled to the battery to measure a discharge capacity of the battery; and a controller, calculating an ideal discharge capacity according to the initial discharge curve, a first open circuit voltage value of the battery at a first time point and a second open circuit voltage value of the battery at a second time point, and controlling the discharge capacity measuring unit to measure a real discharge capacity of the battery between the first time point and the second time point, wherein the controller calibrates the initial discharging curve to generate a current discharging curve according to a total discharge capacity difference between the ideal discharge capacity and the real discharge capacity, wherein the initial discharging curve comprises a plurality of sample points, wherein each sample point corresponds to a discharge capacity and an open circuit voltage, and the controller calibrates discharge intervals between any two adjoining sample points according to the total discharge capacity difference to generate the current discharging curve.

7. The system as claimed in claim 6, wherein the discharge capacity measuring unit is a Coulomb counter.

8. The system as claimed in claim 7, wherein the controller resets the Coulomb counter at the first time point.

9. The system as claimed in claim 6, wherein the controller further acquires a first discharge capacity corresponding to the first open circuit voltage value and a second discharge capacity corresponding to the second open circuit voltage value to calculate the ideal discharge capacity according to the initial discharge curve.

10. The system as claimed in claim 6, wherein the controller calculates a count of discharge intervals between the first time point and the second time point according to the ideal discharge capacity.

11. The system as claimed in claim 10, wherein the controller calculates an averaged discharge capacity difference according to the count of the discharge intervals and the total discharge capacity difference, and calibrates the initial discharging curve according to the averaged discharge capacity difference and the count of the discharge intervals.

* * * * *